(12) United States Patent
Lee

(10) Patent No.: US 8,293,612 B2
(45) Date of Patent: Oct. 23, 2012

(54) LATERAL DOUBLE DIFFUSED METAL OXIDE SEMICONDUCTOR (LDMOS) DEVICE AND METHOD OF MANUFACTURING LDMOS DEVICE

(75) Inventor: Yong Jun Lee, Incheon (KR)

(73) Assignee: Dongbu HiTek Co., Ltd., Seoul (KR)

( * ) Notice: Subject to any disclaimer, the term of this patent is extended or adjusted under 35 U.S.C. 154(b) by 511 days.

(21) Appl. No.: 12/494,028

(22) Filed: Jun. 29, 2009

(65) Prior Publication Data

US 2010/0006937 A1    Jan. 14, 2010

(30) Foreign Application Priority Data

Jul. 9, 2008  (KR) .................. 10-2008-0066539

(51) Int. Cl.
*H01L 29/78*  (2006.01)
*H01L 21/336*  (2006.01)
(52) U.S. Cl. ............... 438/296; 257/343; 257/E29.261
(58) Field of Classification Search .......... 438/296; 257/343, E29.261, E21.417, E21.546
See application file for complete search history.

(56) References Cited

U.S. PATENT DOCUMENTS 6,870,222 B2 * 3/2005 Kim et al. .............. 257/343
7,122,876 B2 * 10/2006 Wu et al. ............... 257/510

* cited by examiner

*Primary Examiner* — Matthew W Such
*Assistant Examiner* — Monica D Harrison
(74) *Attorney, Agent, or Firm* — The Law Offices of Andrew D. Fortney; Andrew D. Fortney; Sharon E. Brown Turner

(57) ABSTRACT

A method for manufacturing a lateral double diffused metal oxide semiconductor (LDMOS) device includes forming an oxide layer on a semiconductor substrate, forming first and second trenches by partially etching the oxide layer and the semiconductor substrate, forming a small trench overlapping with the second trench so that the second trench has a stepped structure, and depositing one or more dielectric layers so that the first trench forms a device isolation layer defining a semiconductor device region and the second trench having a stepped structure forms a drain extension device isolation layer. The breakdown voltage of the LDMOS device may be improved while reducing the on-resistance, thereby improving the operational reliability of the device.

20 Claims, 3 Drawing Sheets

US 8,293,612 B2

LATERAL DOUBLE DIFFUSED METAL OXIDE SEMICONDUCTOR (LDMOS) DEVICE AND METHOD OF MANUFACTURING LDMOS DEVICE

This application claims the benefit of the Korean Patent Application No. 10-2008-0066539, filed on 9 Jul. 2008, which is hereby incorporated by reference as if fully set forth herein.

BACKGROUND OF THE INVENTION

1. Field of the Invention

The present invention relates to a lateral double diffused metal oxide semiconductor (LDMOS) device and a manufacturing method for the same.

2. Discussion of the Related Art

A lateral double diffused metal oxide semiconductor (LDMOS) is a sort of majority carrier device and also a representative of lateral type power device having quick switching responsiveness and high input impedance.

FIG. 1 is a cross-sectional view showing the structure of a conventional LDMOS device. Referring to the drawing, a semiconductor substrate 100 is divided by a device isolation layer 105 into a low voltage MOS (LV MOS) region A disposed on the left, and a high voltage MOS (HV MOS) region B disposed on the right.

The LV MOS region A and the HV MOS region B include gate electrodes 115 and 125, gate dielectric layers 135 and 200, source regions 145 and 180, source electrodes 155 and 185, drain regions 150 and 190, drain electrodes 160 and 195, spacers 120 and 130, P-type well regions 140 and 165. The HV MOS region B further includes an N-type well region 170. In addition, the HV MOS region B includes a P-type body 175 formed in the P-type well region 165, and a device isolation layer for drain extension 110.

Generally, in case of an HV MOS region over 30V, the drain extension device isolation layer 110 is formed between the gate electrode 125 and the drain region 190 in order to prevent concentration of electric fields on the edge of the gate electrode 125. The drain extension device isolation layer 110 may be a local oxidation of silicon (LOCOS) layer. In case of a submicron HV MOS, the drain extension device isolation layer 110 may have a shallow trench isolation (STI) structure.

Here, the drain extension device isolation layer 110 may be a part of the gate dielectric layer 200 extended to elongate a channel for a high-voltage current. A current generated from the source region 180 flows to the drain region 190 passing through, along or in the silicon adjacent to a surface of the drain extension device isolation layer 110.

Although the above-structured device isolation layer may improve a breakdown voltage, on the other hand, an on-resistance $R_{on}$ is increased. Accordingly, the current drive capability may be less than optimal.

Especially, when the device isolation layer 110 has the STI structure, a border part adjoining the gate dielectric layer 200 is susceptible to a high-voltage current. Therefore, when electric fields are concentrated, a surface breakdown may be incurred. Accordingly, it becomes important to design the power device to have a minimal on-resistance while maintaining the breakdown voltage, which is in a trade-off relationship with the on-resistance.

SUMMARY OF THE INVENTION

Accordingly, the present invention is directed to a lateral double diffused metal oxide semiconductor (LDMOS) device and a method for manufacturing the same that substantially obviate one or more problems due to limitations and disadvantages of the related art.

An object of the present invention is to provide an LDMOS device capable of increasing a breakdown voltage while reducing an on-resistance of the device (e.g., having substantially the same dimensions as the related art device), and a method for manufacturing the same.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an LDMOS device includes In another aspect of the present invention, a manufacturing method for an LDMOS device includes It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle of the invention. In the drawings.

DETAILED DESCRIPTION OF THE INVENTION

Reference will now be made in detail to a lateral double diffused metal oxide semiconductor (LDMOS) device according to exemplary embodiment(s) of the present invention, examples of which are illustrated in the accompanying drawings. Wherever possible, the same reference numbers will be used throughout the drawings to refer to the same or like parts.

In the following description, only features directly related to the invention will be explained while omitting description about well-known functions, structures, and components so as not to obscure the present invention.

It will be understood that when an element such as a layer, region, pattern or structure is referred to as being "on" or "under" another element, the element may be disposed "directly" on another element or "indirectly" by having one or more interposing elements between them.

Figure 7:
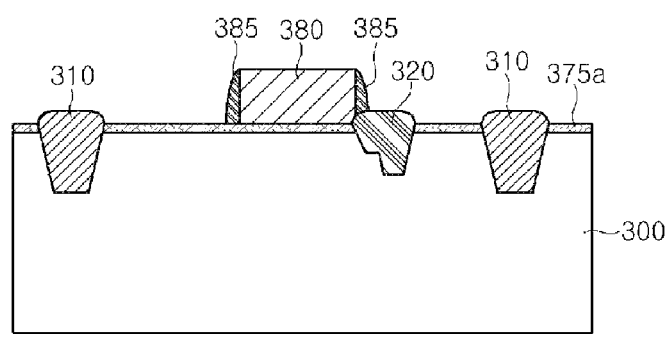
FIG. 7 is a cross-sectional view of an exemplary LDMOS precursor device in which a gate electrode is formed.
Figure 8:
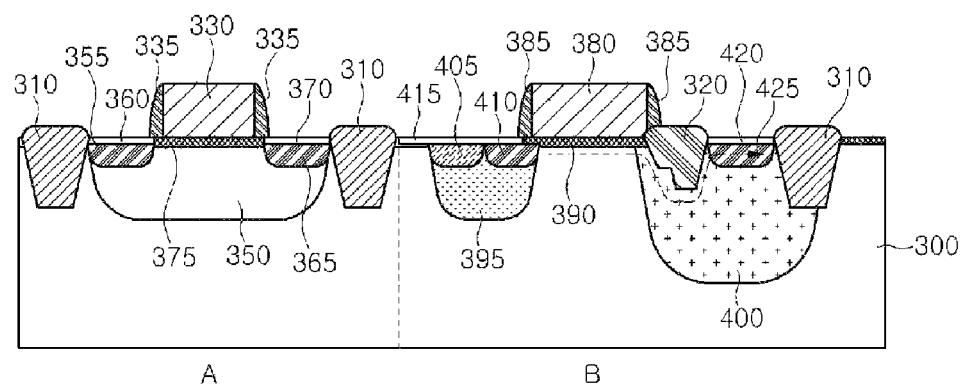
FIG. 8 is a cross-sectional view showing an exemplary LDMOS device according to an embodiment of the present invention.

Referring to FIG. 8, the LDMOS device according to an embodiment of the present invention includes a low voltage MOS (LV MOS) transistor or region A and a high voltage drain extended MOS (HV DEMOS) transistor or region B separated by a device isolation layer 310. Since the exemplary LDMOS device of the invention is related to the structure of the HV DEMOS region B, only the HV DEMOS region B is illustrated in FIG. 2 to FIG. 7.

Figure 1:
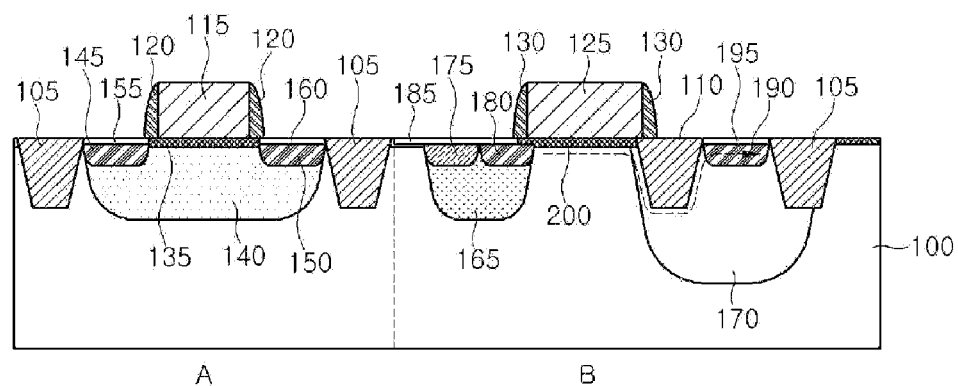
FIG. 1 is a cross-sectional view showing the structure of a conventional lateral double diffused metal oxide semiconductor (LDMOS) device.
Figure 2:
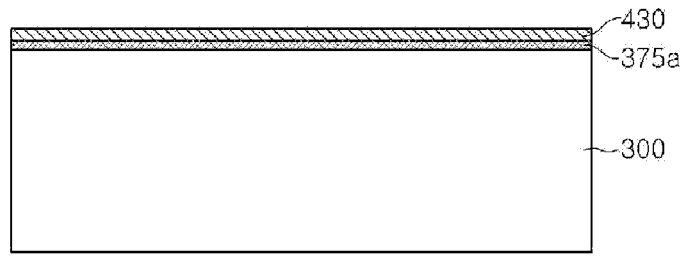
FIG. 2 is a cross-sectional view showing a precursor structure for an exemplary LDMOS device in which an oxide layer and a nitride layer are formed on a semiconductor substrate, according to an embodiment of the present invention.

FIG. 2 is a cross-sectional view showing the LDMOS device region in a state where an oxide layer 375a and a nitride layer 430 are formed on a semiconductor substrate 300. More specifically, the oxide layer 375a is formed on the semiconductor substrate 300, for example, by physical or chemical vapor deposition (PVD or CVD) or by wet or dry thermal oxidation. The semiconductor substrate 300 may comprise or consist essentially of, for example, a monocrystalline silicon substrate. Next, the nitride layer 430 is formed on the oxide layer 375a, generally by PVD or CVD. For example, the oxide layer 375a may comprise or consist essentially of, for example, a $SiO_2$ layer having a thickness of about 100~150 Å. The nitride layer 540 may comprise or consist essentially of, for example, a $Si_3N_4$ layer having a thickness of about 500~600 Å.

The nitride layer 430 is used as an etching mask (e.g., a hard mask for etching one or more isolation trenches). The oxide layer 375a may form a gate dielectric layer through subsequent processes that will be explained hereinafter.

Figure 3:
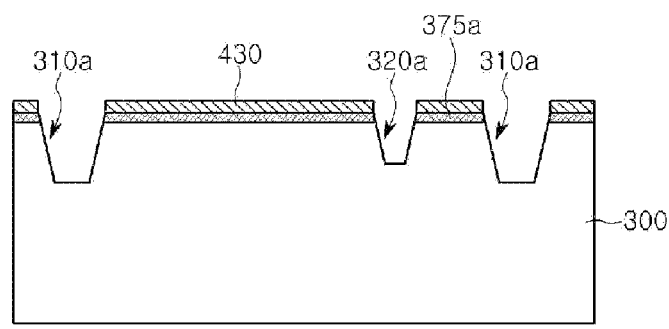
FIG. 3 is a cross-sectional view of a further precursor structure for an exemplary LDMOS device in which first and second trenches are formed on the semiconductor substrate, according to an embodiment of the present invention.

FIG. 3 is a cross-sectional view showing the exemplary LDMOS device region in a state where a first trench 310a and a second trench 320a are formed in the semiconductor substrate 300.

A first photoresist is applied or deposited on an upper part or surface of the oxide layer 375a. Afterward, reticle alignment, exposure and developing are performed, thereby forming a first photoresist pattern (not shown). Next, the nitride layer 430, the oxide layer 375a, and part of an upper side of the semiconductor substrate 300 are etched using the first photoresist pattern as an etching mask, and then the first photoresist pattern is removed. Accordingly, opening regions are formed in the nitride layer 430 and the oxide layer 375a. The first trench 310a and the second trench 320a are formed in the semiconductor substrate 300 at positions corresponding to the opening regions in the nitride layer 430 and the oxide layer 375a.

The first trench 310a is provided to form a device isolation layer that separates the LV MOS region A from the HV DEMOS region B, and/or that separates two adjacent HV DEMOS regions from each other. The second trench 320a is provided to form at least part of a drain extension device isolation layer.

The second trench 320a is shallower than the first trench 310a. Depths of the trenches 310a and 320a may be controlled by adjusting the respective sizes of the opening regions of the first photoresist pattern. For example, the opening in the nitride layer 430 and the oxide layer 375a over the second trench 320a may be from 0.10 to 0.35 microns, while the opening in the nitride layer 430 and the oxide layer 375a over the first trench 310a may be from 0.15 to 1.0 microns. Alternatively, the depth of the second trench 320a may be from 1000 Å to 3500 Å, and the depth of the first trench 310a may be from 1500 Å to 6000 Å. Thus, the ratio of opening in the nitride and oxide layers 430 and 375a over the second trench 320a to the opening in the nitride and oxide layers 430 and 375a over the first trench 310a, and/or the ratio of the depth of the second trench 320a to the first trench 310a, may independently be from about 0.5:1 to about 0.8:1.

Figure 4:
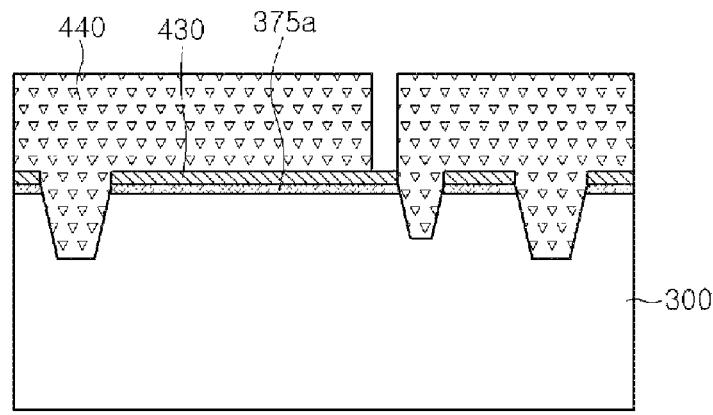
FIG. 4 is a cross-sectional view of a still further precursor structure for an exemplary LDMOS device in which a second photoresist pattern is formed.

FIG. 4 is a cross-sectional view of the LDMOS device in which a second photoresist pattern 440 is formed.

The first trench 310a and the second trench 320a are filled with a photoresist, and a second photoresist pattern 440 is formed on the patterned nitride layer 430. The second photoresist pattern 440 has an opening disposed next to the second trench 320a having a smaller size than the second trench 320a. Alternatively, the opening in the second photoresist pattern 440 may have a similar or even greater size (e.g., width) than the second trench 320a, in which case the opening may overlap with the second trench 320a.

Figure 5:
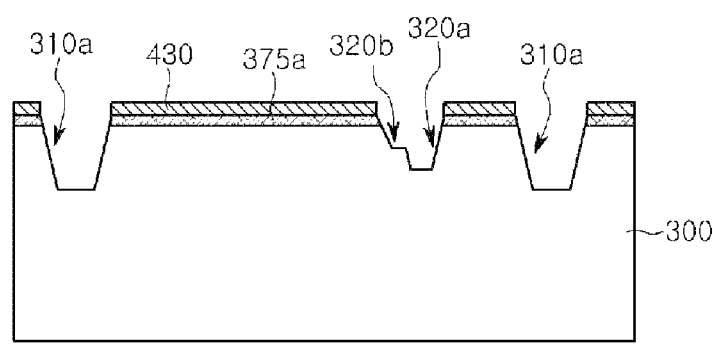
FIG. 5 is a cross-sectional view of an exemplary substrate structure for an exemplary LDMOS device in which the second trench having a stepped structure is formed.

FIG. 5 is a cross-sectional view of the LDMOS device in a state where second trenches 320a and 320b are formed in a stepped structure.

The nitride layer 430, the oxide layer 375a and a part of the upper side of the semiconductor substrate 300 are etched using the second photoresist pattern 440 as an etching mask. The nitride layer 430 may be etched selectively with respect to the oxide layer 375a and the substrate 300, and the oxide layer 375a may be etched selectively with respect to the substrate 300. Such etching may be wet (e.g., using an aqueous etchant such as aqueous phosphoric acid in the case of nitride layer 430 or aqueous hydrofluoric acid in the case of oxide layer 375a. The substrate 300 may be etched to a depth less than that of trench 320a, and so that a sloped sidewall forms. The depth of second trench portion 320b may be about 30 to 80% (e.g., 40 to 65%) of the depth of second trench portion 320a. The slope of the second trench portion 320b may be from 75° to 88° (e.g., 80° to 85°) relative to the horizontal surface of substrate 300. The second photoresist pattern 440 is then removed.

According to this, a small trench 320b overlapping the second trench 320a is formed, thereby configuring the second trench 320a into a stepped double trench structure.

Figure 6:
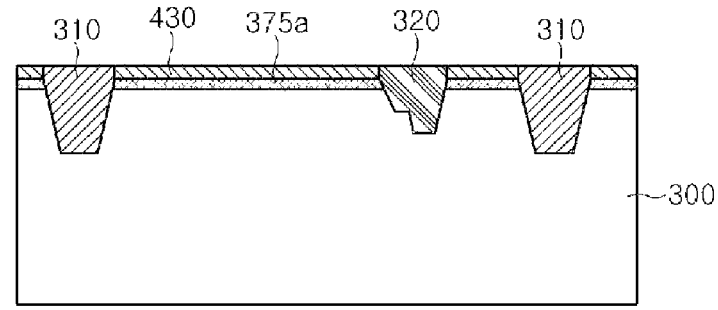
FIG. 6 is a cross-sectional view of an exemplary substrate structure for an exemplary LDMOS device in which device isolation layers are formed.

FIG. 6 is a cross-sectional view of the LDMOS device in a state where the device isolation layers 310 and 320 are formed.

The first trench 310a and the second trench 320a are filled with a dielectric layer, which is also formed on the nitride layer 430. The dielectric layer may comprise a silicon oxide (such as silicon dioxide) and may be deposited by chemical vapor deposition (e.g., high density plasma-assisted CVD). Prior to deposition of the oxide that forms shallow trench isolation (STI) structures 310 and 320, a thin thermal oxide layer may be grown in exposed areas of the trenches 310a, 320a and 320b.

Next, the dielectric layer is planarized, for example by chemical mechanical polishing (CMP), using the nitride layer 430 as a polish stop layer, thereby forming STI structures 310 and 320.

FIG. 7 is a cross-sectional view of the LDMOS device in a state where a gate electrode 380 is formed.

The nitride layer 430 is removed so that the device isolation layers 310 and 320 as shown in FIG. 7 are formed. Here, the nitride layer 430 may be removed by wet etching using a phosphoric acid solution. Here, upper edges of the dielectric layers embedded in the first and the second trenches 310a and 320a are rounded, thereby achieving the shapes of the device isolation layers 310 and 320 as shown in FIG. 7.

After the device isolation layers 310 and 320 are completed, well regions 350, 395 and 400 (FIG. 8) are formed through photolithographic masking and ion implantation.

Next, a thin silicon oxide layer 375a is formed on the substrate 300 (generally by thermal oxidation), and a polysilicon layer is formed on the device isolation layers 310 and 320 and the oxide layer 375a. The oxide layer 375a may have a thickness of 20-100 Å. The thickness of oxide layer 375a may depend on the voltage applied to the overlying polysilicon gate electrode. In addition, prior to deposition of the polysilicon layer, a relatively low voltage (LV) region of the substrate 300 may be masked, and the oxide layer 375a in the HV DEMOS region may be made thicker (e.g., by 10-50 Å, for example by wet or dry thermal oxidation). The polysilicon layer and the oxide layer 375a are patterned, thereby forming the gate electrode 380 and a gate dielectric layer 390 next to the drain extension device isolation layer 320.

Spacers 385 are formed on sides of the gate electrode 380, generally by conformal, blanket deposition of one or more dielectric layers (e.g., silicon oxide and/or silicon nitride) and anisotropic etching.

The gate electrode 380 may have a thickness of about 200~300 Å in one embodiment, and a thickness of about 2000~3000 Å in another embodiment.

FIG. 8 is a cross-sectional view showing the LDMOS device according to an exemplary embodiment of the present invention, including the LV MOS region A and the HV DEMOS region B. Although only the HV DEMOS region B has been explained with reference to FIG. 2 to FIG. 7, the device isolation layer 310, the P-type well region 350, a gate dielectric layer 375, a gate electrode 330, a spacer 335 of the LV MOS region A may be fabricated together with corresponding parts of the HV DEMOS region B.

N+ ions are implanted in the P-type well region 350 of the LV MOS region A, thereby forming a source region 355 and a drain region 365 between the device isolation layer 310 and the spacer 335. Also, P+ ions and N+ ions are implanted in the P-type well region 395 of the HV DEMOS region B, thereby forming a P-type body 405 and a source region 410.

In addition, N+ ions are implanted in the N-type well region 400 of the HV DEMOS region B so that a drain region 425 is formed between the drain extension device isolation layer 320 and the device isolation layer 310.

Next, silicide processing (e.g., blanket deposition of a silicide-forming metal such as titanium, tantalum, tungsten, molybdenum, nickel or cobalt [for example by sputtering], followed by annealing to form a conductive metal silicide) is performed to form source electrodes 360 and 415 and drain electrodes 370 and 420 respectively in the source regions 355, 405 and 410 and the drain regions 365 and 425 of the LV MOS region A and the HV DEMOS region B.

According to the above embodiment, the drain extension device isolation layer 320 may have a reduced depth owing to the stepped structure of the double trench, and may also be improved in the susceptible gate edge. Consequently, a path of the current can be reduced in comparison with in the conventional structure. Also, the high voltage bias applied to a drain terminal 420 may be prevented from concentrating on the gate edge. As a result, the on-resistance of the semiconductor device can be reduced while the breakdown voltage is increased.

As apparent from the above description, in accordance with the LDMOS device and method for manufacturing the same according to any of the above-described embodiments of the present invention, the breakdown voltage of the LDMOS device can be improved by using the double-trench device isolation layer while reducing the on-resistance simultaneously. As a result, reliability of the operation of the semiconductor device can be enhanced.

It will be apparent to those skilled in the art that various modifications and variations can be made in the present invention without departing from the spirit or scope of the inventions. Thus, it is intended that the present invention covers modifications and variations of this disclosure provided they come within the scope of the appended claims and their equivalents.

What is claimed is:

1. A method for manufacturing a lateral double diffused metal oxide semiconductor (LDMOS) device, comprising:
    forming an oxide layer on a semiconductor substrate;
    forming first and second trenches by partially etching the oxide layer and the semiconductor substrate;
    forming a small trench overlapping with the second trench by etching the semiconductor substrate so that the second trench has a stepped structure;
    depositing one or more dielectric layers into the first and second trenches so that the first trench forms a device isolation layer defining a semiconductor device region and the second trench having the stepped structure forms a drain extension device isolation layer;
    forming a gate dielectric layer and a gate electrode adjoining the drain extension device isolation layer; and
    forming a drain region and a source region in the semiconductor substrate.

2. The method according to claim 1, wherein the oxide layer comprises silicon oxide and has a thickness of about 100~150 Å.

3. The method according to claim 1, wherein forming the first and the second trenches comprises:
    forming a first photoresist pattern on the oxide layer to define regions for the first trench and the second trench; and
    etching the first and the second trenches using the first photoresist pattern as an etching mask.

4. The method according to claim 3, wherein depths of the first and the second trenches depend on a size of a corresponding opening in the first photoresist pattern.

5. The method according to claim 1, wherein forming the small trench comprises:
    forming a second photoresist pattern on the semiconductor substrate including the first trench, the second trench, and the oxide layer, so as to define a region for the small trench adjacent to the second trench; and
    etching the small trench using the second photoresist pattern as an etching mask.

6. The method according to claim 5, wherein a depth of the small trench depends on a size of a corresponding opening in the second photoresist pattern.

7. The method according to claim 1, wherein the small trench is shallower than the second trench, and the second trench is shallower than the first trench.

8. The method according to claim 1, wherein forming the oxide layer on the semiconductor substrate further comprises forming a nitride layer on the oxide layer, and
    forming the first and the second trenches further comprises etching part of the nitride layer, and
    forming the drain extension device isolation layer further comprises:
        depositing a dielectric layer on the nitride layer and filling the first and the second trenches with the dielectric layer, and planarizing the dielectric layer using the nitride layer as a polish stop layer; and removing the nitride layer.

9. The method according to claim 8, wherein the nitride layer comprises silicon nitride and has a thickness of about 500~600 Å.

10. The method according to claim 1, further comprising:
forming well regions in the substrate, wherein the drain region is formed in a first well region next to the drain extension device isolation region and the source region is formed in a second well region at one side of the gate electrode; and
forming spacers on sides of the gate electrode.

11. The method according to claim 10, wherein the drain extension device isolation layer, the well regions, the gate electrode, the gate dielectric layer, the spacers, the drain region, and the source regions are formed in a high voltage drain extended MOS (HV DEMOS) region defined by the device isolation layer, and
component parts corresponding to the well regions, the gate electrode, the gate dielectric layer, the spacers, the drain region, and the source region are also formed on a low voltage MOS (LV MOS) region defined by the device isolation layer during manufacturing of each corresponding part in the HV DEMOS region.

12. The method according to claim 1, wherein forming the gate dielectric layer and the gate electrode comprises forming a gate oxide layer on the substrate, depositing a polysilicon layer on the gate oxide layer, and etching the polysilicon layer and the gate oxide layer.

13. The method according to claim 1, comprising forming the source region in a first well region at one side of the gate electrode and forming the drain region in a second well region surrounding the drain extension device at an opposite side of the gate electrode.

14. The method according to claim 1, wherein the small trench has a depth that is 30-80% of a depth of the second trench.

15. The method according to claim 14, wherein the second trench has a depth that is 50-80% of a depth of the first trench.

16. The method according to claim 1, further comprising forming a first well region in the semiconductor substrate under the drain extension device isolation layer, the drain region, and one of the device isolation layers.

17. The method according to claim 16, further comprising forming a second well region in the semiconductor substrate under the source region.

18. The method according to claim 1, further comprising growing a thermal oxide layer in exposed areas of the first and second trenches before depositing the one or more dielectric layers.

19. The method according to claim 1, wherein the gate oxide layer has a thickness of 20 to 100 Å and the gate electrode has a thickness of about 200 to 300 Å.

20. The method according to claim 1, further comprising forming a source electrode in the source region and a drain electrode in the drain region.

\* \* \* \* \*